United States Patent
Lu

(10) Patent No.: US 7,259,708 B2
(45) Date of Patent: Aug. 21, 2007

(54) CYCLIC PIPELINE ANALOG TO DIGITAL CONVERTER WITH ENHANCED ACCURACY

(75) Inventor: Woody Lu, Shindian (TW)

(73) Assignee: VIA Technologies, Inc., Taipei (TW)

( * ) Notice: Subject to any disclaimer, the term of this patent is extended or adjusted under 35 U.S.C. 154(b) by 0 days.

(21) Appl. No.: 11/448,037

(22) Filed: Jun. 7, 2006

(65) Prior Publication Data

US 2006/0279448 A1 Dec. 14, 2006

(30) Foreign Application Priority Data

Jun. 8, 2005 (TW) ................................ 94118942 A

(51) Int. Cl.
    *H03M 1/34* (2006.01)
(52) U.S. Cl. ..................... 341/163; 341/155; 341/144
(58) Field of Classification Search ................ 341/155, 341/144, 163, 141, 122, 110
    See application file for complete search history.

(56) References Cited

U.S. PATENT DOCUMENTS

| 4,215,411 | A | * | 7/1980 | Franzen ........................ 702/23 |
| 5,030,954 | A | * | 7/1991 | Ribner ........................ 341/172 |
| 5,294,927 | A | * | 3/1994 | Levinson et al. ........... 341/141 |
| 5,621,408 | A | * | 4/1997 | Cake et al. ................... 341/143 |
| 5,815,046 | A | * | 9/1998 | Spilker et al. ............... 332/103 |
| 7,151,475 | B2 | * | 12/2006 | Boemler ..................... 341/155 |
| 2005/0038846 | A1 | * | 2/2005 | Devendorf et al. ......... 708/801 |

* cited by examiner

*Primary Examiner*—Peguy JeanPierre
(74) *Attorney, Agent, or Firm*—Birch, Stewart, Kolasch & Birch, LLP

(57) ABSTRACT

A cyclic pipeline analog to digital converter includes a sample/hold module, a sub-analog/digital converting module, and an alternate digital/analog converting module. The sample/hold module generates a sample signal according to an analog-input signal and a residue signal. The sub-analog/digital converting module generates a first control signal and a second control signal alternately in different time according to the converting result of the sample signal. The alternate digital/analog converting module decides to receive a first reference signal and a second reference signal separately according to the first control signal and the second control signal. The alternate digital/analog converting module generates a first transfer signal according to at least the sample signal among the sample signal, the first reference signal and a first feedback signal, and generates a second transfer signal according to at least the sample signal among the sample signal, the second reference signal and a first feedback signal. The alternate digital/analog converting module generates the first feedback signal and the residue signal according to one of the first transfer signal and the second transfer signal.

13 Claims, 8 Drawing Sheets

CYCLIC PIPELINE ANALOG TO DIGITAL CONVERTER WITH ENHANCED ACCURACY

BACKGROUND OF THE INVENTION

1. Field of Invention

The invention relates to a cyclic pipeline analog to digital converter, and more particularly to a cyclic pipeline analog to digital converter with highly enhanced accuracy.

2. Related Art

Analog to digital converters have been widely used in various digital electrical products, such as digital cameras, digital voice recorders, and the like. In the conventional converters, the pipeline analog to digital converter and the cyclic pipeline analog to digital converter are frequently used now.

Referring to FIG. 1, the pipeline analog to digital converter 1 includes a sample/hold module 11, a converting module 12 and a delay digital correction module 13. The sample/hold module 11 samples an input signal 111 and then generates a sample signal 112. The converting module 12 includes N-th stages of sub-converting units 121 to 129. The first stage of sub-converting unit 121 generates a first transfer signal 121T and a first output signal 121P according to the sample signal 112. The second stage of sub-converting unit 122 generates a second transfer signal 122T and a second output signal 122P according to the sample signal 121P. Similarly, the (N−1)-th stage of sub-converting unit 12N generates an (N−1)-th transfer signal 12NT and an output signal 12NP according to a previous stage of output signal, wherein (N−1) is a positive integer greater than 1. The N-th stage of sub-converting unit generates an N-th transfer signal 129T only according to a previous stage of output signal. Finally, the delay digital correction module 13 properly corrects each stage of transfer signal 121T to 129T and thus generates a digital signal 131. However, each stage of sub-converting unit of the pipeline analog to digital converter 1 has similar functions, so the stages of sub-converting units may be integrated into a single stage of cyclic pipeline analog to digital converter by way of cyclic design.

As shown in FIG. 2, the conventional cyclic pipeline analog to digital converter 2 includes a sample/hold module 21, a sub-analog/digital converting module 22, a digital/analog converting module 23 and a delay digital correction module 24.

The sample/hold module 21 samples an input signal 211 and generates a sample signal 213 according to the input signal 211 and a residual signal 212. The sub-analog/digital converting module 22 generates a digital conversion signal 221 to 223 according to the sample signal 213. The digital/analog converting module 23 firstly receives the sample signal 213, and then decides to receive reference signals 251 to 253 according to the digital conversion signals 221 to 223, respectively. Finally, the updated residual signal 212 is generated, and the sample/hold module 21 updates the sample signal 213 according to the updated residual signal 212 in the cyclic processing manner until the designed cyclic number of the converter 2 is reached. Then, the delay digital correction module 24 properly corrects the digital conversion signals 221 to 223, which are generated at different time during the cyclic process, and thus generates a digital signal 241.

Referring to FIG. 3, the digital/analog converting module 23 includes a plurality of switches 231 to 236, a capacitor 237, a capacitor 238 and an amplifier 239. The switches 234 and 235 are simultaneously ON to make the capacitors 237 and 238 receive the sample signal 213 and be charged, respectively. At this time, the switches 231 to 233 and the switch 236 are OFF. Then, the switches 234 and 235 are simultaneously OFF to make the capacitors 237 and 238 output a transfer signal 237A and a transfer signal 238A to the amplifier 239, respectively. Meanwhile, one of the switches 231 to 233 and the switch 236 are simultaneously ON to make the amplifier 239 and the capacitor 238 become a feedback circuit. At this time, the switches 231 to 233 are decided to be ON to input one of the reference signals 251 to 253 to the capacitor 237 and to charge the capacitor 237 according to the digital conversion signals 221 to 223, respectively. The amplifier 239 generates the residual signal 212 according to the transfer signals 237A and 238A. At this time, the voltage relationship among the feedback signal of the amplifier 239 and the capacitor 238, the sample signal 213 and one of the reference signals 251 to 253 is described by Equation 1:

$$V_{feedback} = \left(\frac{C_{237} + C_{238}}{C_{238}}\right)V_{213} + \left(\frac{C_{237}}{C_{238}}\right)V_{25} \quad \text{(Equation 1)}$$

Wherein, $V_{feedback}$ is the voltage of the feedback signal, $V_{213}$ is the voltage of the sample signal 213, $V_{25}$ is the voltage of one of the reference signals 251 to 253, $C_{237}$ and $C_{238}$ are capacitances of the capacitor 237 and the capacitor 238, respectively, and the voltage of the residual signal 212 is the same as the voltage $V_{feedback}$ of the feedback signal.

The cyclic pipeline analog to digital converter 2 can rapidly convert an analog signal into a digital signal. As shown in Equation 1, however, the matching between the capacitor 237 and the capacitor 238 may influence the generation of the residual signal 212, the residual signal 212 may influence the generation of the sample signal 213, the sample signal 213 may influence the processing results of the sub-analog/digital converting module 22 and the digital/analog converting module 23, and then influence the residual signal 212 in the digital/analog converting module 23. Such a vicious circle deteriorates the precision of the converter 2.

Consequently, it is an important subject of the invention to provide a cyclic pipeline analog to digital converter in order to ease the influence of the element matching in the digital/analog converting module, and thus enhance the precision of the analog to digital converter.

SUMMARY OF THE INVENTION

In view of the foregoing, the invention is to provide a cyclic pipeline analog to digital converter capable of easing the influence of element matching problem in the analog to digital converter.

To achieve the above, a cyclic pipeline analog to digital converter of the invention includes a sample/hold module, a sub-analog/digital converting module and an alternate digital/analog converting module. In the invention, the sample/hold module generates a sample signal according to an analog-input signal and a residue signal. The sub-analog/digital converting module generates a first control signal and a second control signal alternately in different time according to the converting result of the sample signal. The alternate digital/analog converting module decides to receive a first reference signal and a second reference signal separately according to the first control signal and the second control signal. The alternate digital/analog converting module generates a first transfer signal according to at least the sample signal among the sample signal, the first reference signal and a first feedback signal, and generates a second transfer signal according to at least the sample signal among the sample signal, the second reference signal and a first feedback signal. The alternate digital/analog converting module generates the first feedback signal and the residue signal according to one of the first transfer signal and the second transfer signal.

As mentioned above, in the cyclic pipeline analog to digital converter of the invention, the sub-analog/digital converting module alternately generates the first control signal and the second control signal at different time, so the alternate digital/analog converting module can alternately generate the residual signal according to the first control signal and the second control signal. Thus, the influence of the element matching in the digital/analog converting module may be eased such that the analog to digital converting result may be correctly generated.

BRIEF DESCRIPTION OF THE DRAWINGS

The invention will become more fully understood from the detailed description given herein below illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

A cyclic pipeline analog to digital converter of the invention includes a sample/hold module, a sub-analog/digital converting module and an alternate digital/analog converting module. In the invention, the sample/hold module generates a sample signal according to an analog-input signal and a residue signal. The sub-analog/digital converting module generates a first control signal and a second control signal alternately in different time according to the converting result of the sample signal. The alternate digital/analog converting module decides to receive a first reference signal and a second reference signal separately according to the first control signal and the second control signal. The alternate digital/analog converting module generates a first transfer signal according to at least the sample signal among the sample signal, the first reference signal and a first feedback signal, and generates a second transfer signal according to at least the sample signal among the sample signal, the second reference signal and a first feedback signal. The alternate digital/analog converting module generates the first feedback signal and the residue signal according to one of the first transfer signal and the second transfer signal.

Figure 1:
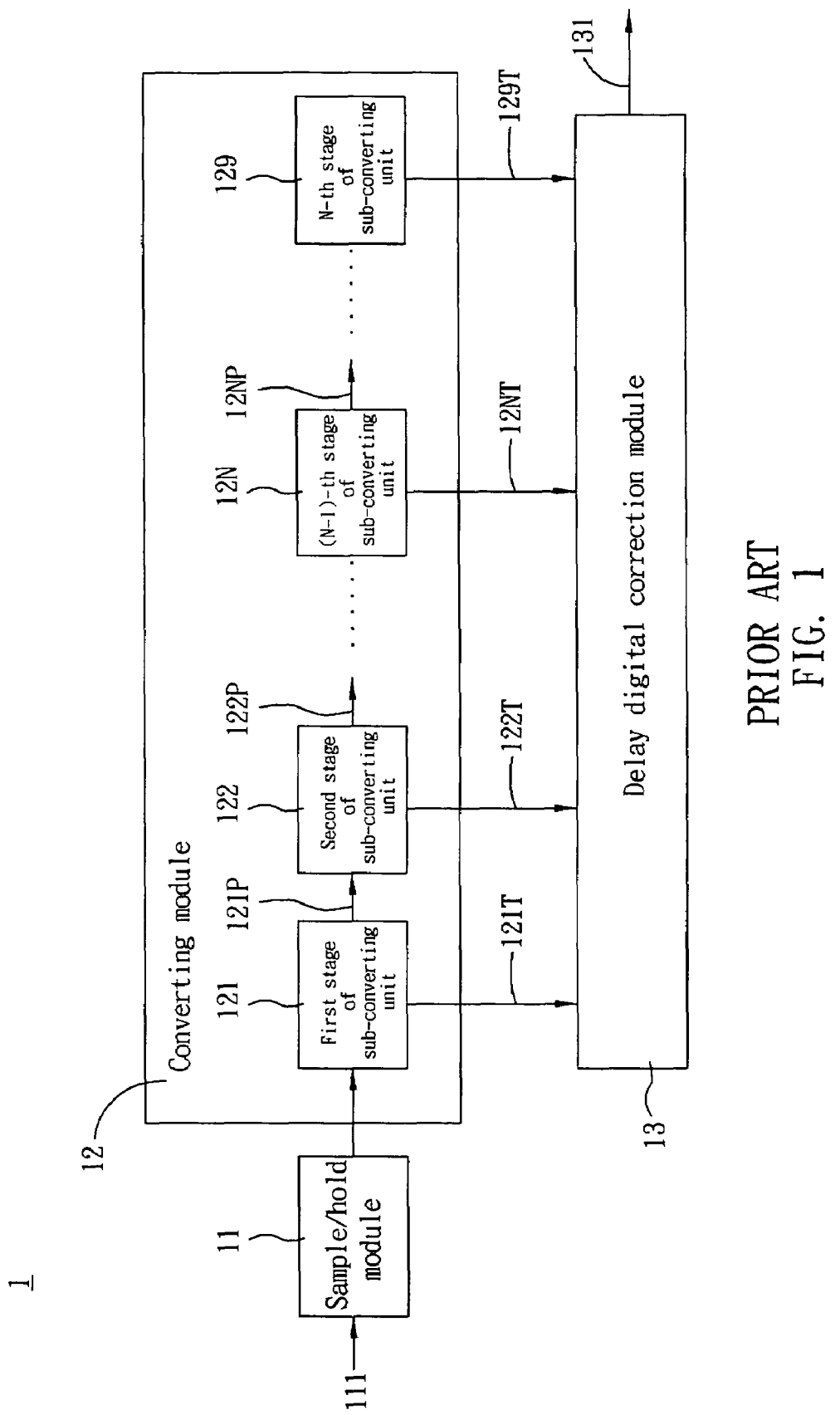
FIG. 1 is a block diagram showing a conventional pipeline analog to digital converter.
Figure 2:
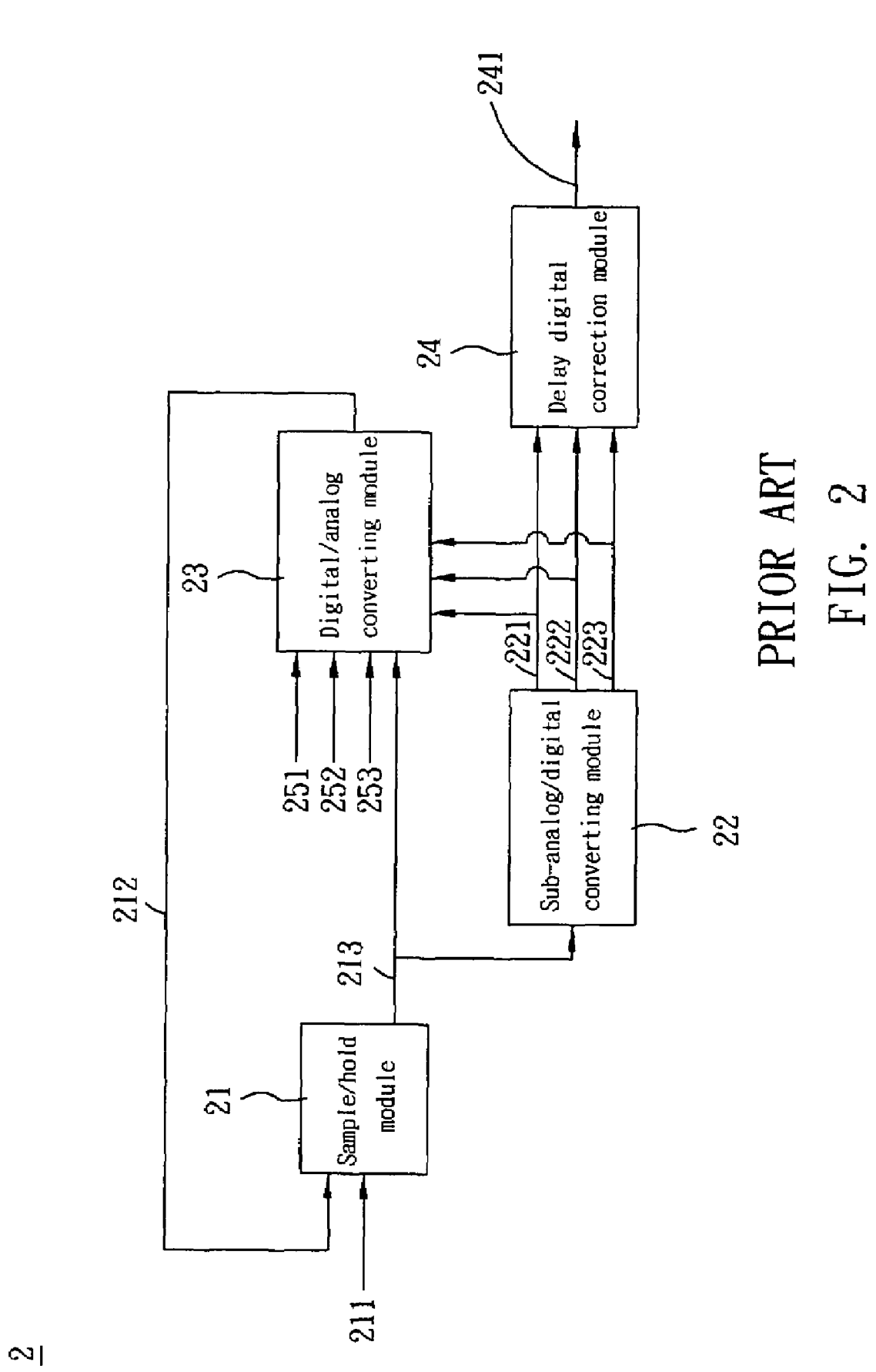
FIG. 2 is a block diagram showing a cyclic pipeline analog to digital converter.
Figure 3:
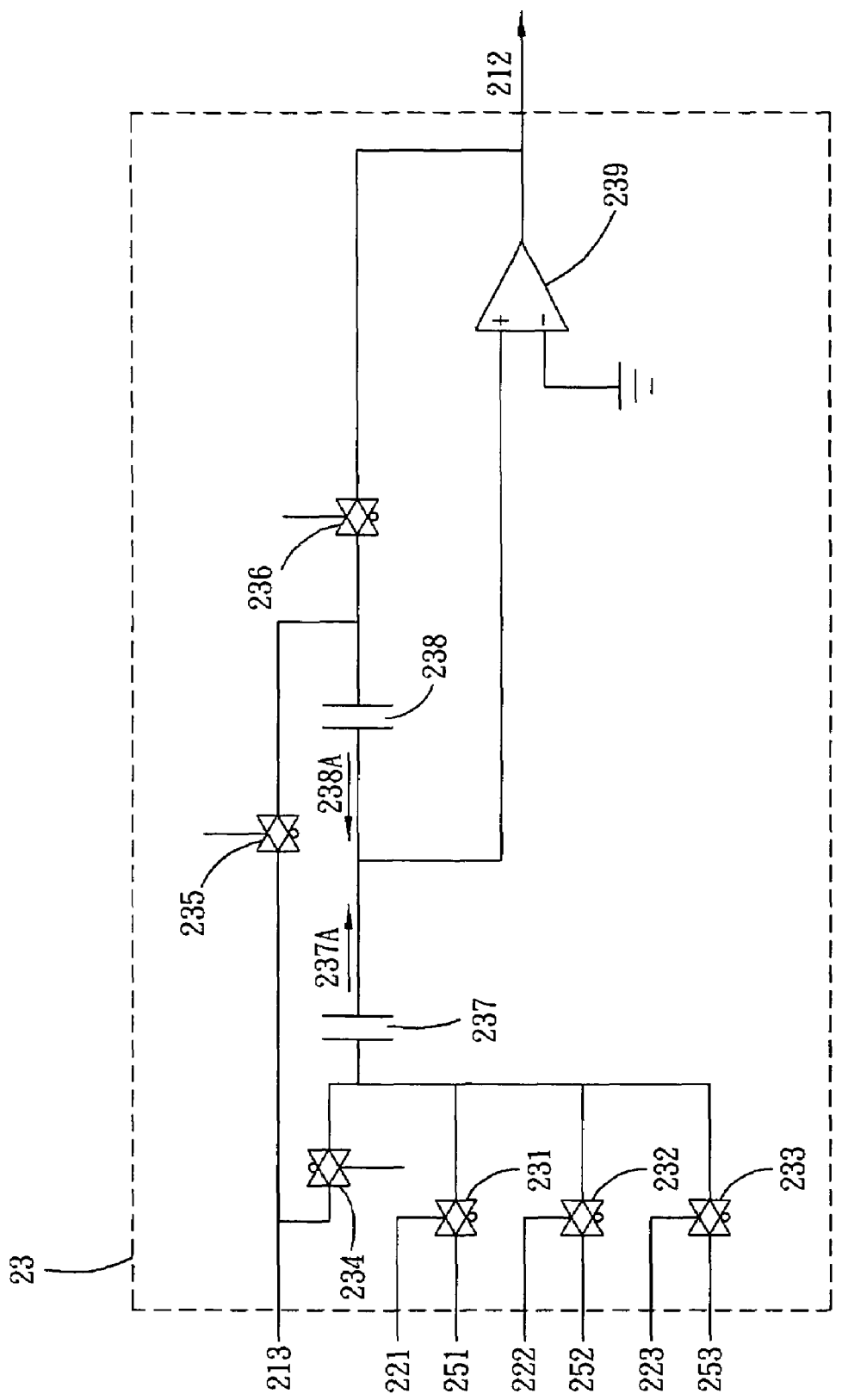
FIG. 3 is a circuit diagram showing a digital/analog converting module in the conventional cyclic pipeline analog to digital converter.
Figure 4:
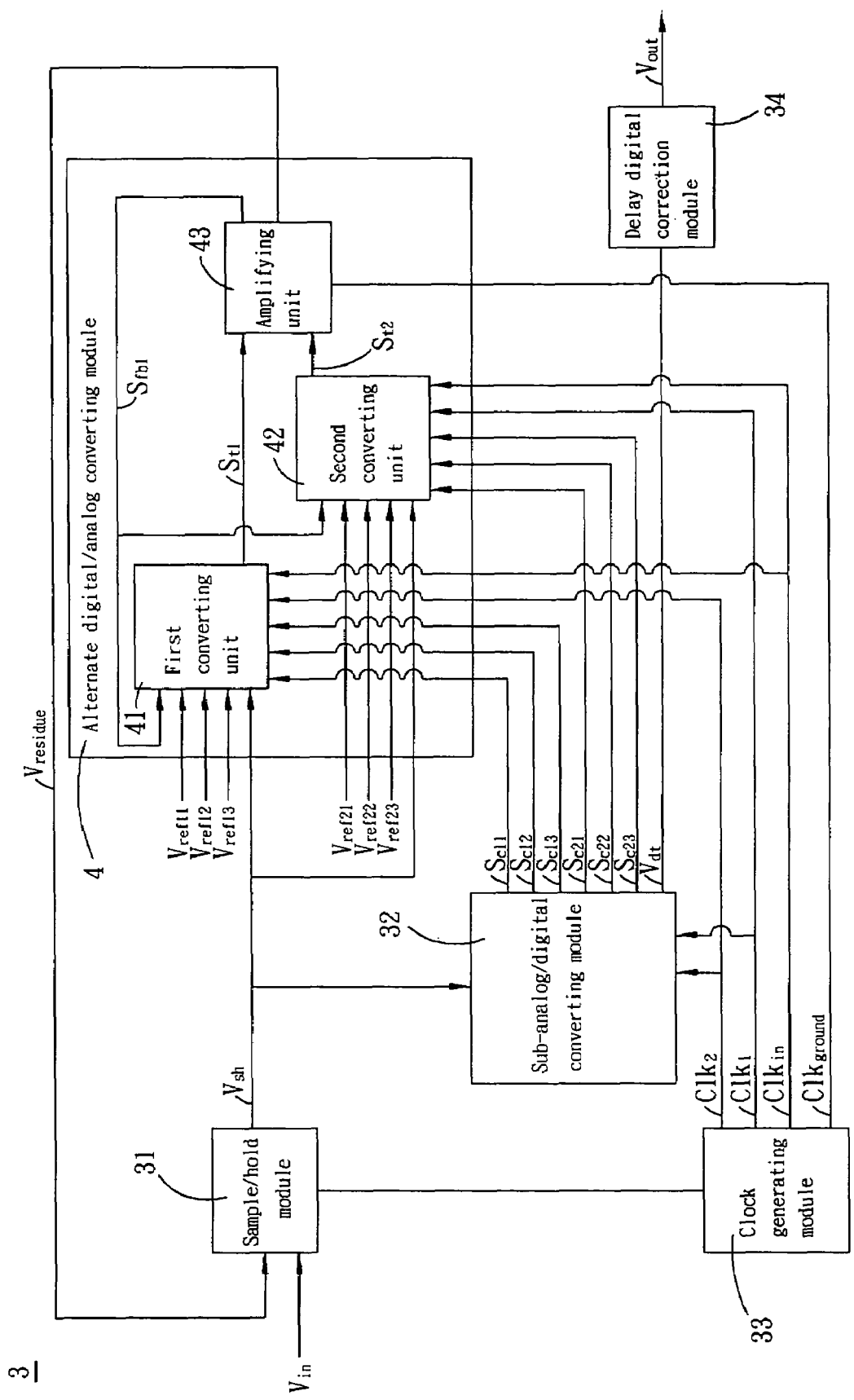
FIG. 4 is a block diagram showing a cyclic pipeline analog to digital converter according to one embodiment of the invention.

Referring to FIG. 4, a cyclic pipeline analog to digital converter 3 according to the embodiment of the invention includes a sample/hold module 31, a sub-analog/digital converting module 32 and an alternate digital/analog converting module 4.

In this embodiment, the sample/hold module 31 generates a sample signal $V_{sh}$ according to an analog-input signal $V_{in}$ and a residual signal $V_{residue}$. The sub-analog/digital converting module 32 generates first control signals $S_{c11}$ to $S_{c13}$ and second control signals $S_{c21}$ to $S_{c23}$ alternately according to a digital converting result at different time of the sample signal $V_{sh}$.

The alternate digital/analog converting module 4 decides to receive first reference signals $V_{ref11}$ to $V_{ref13}$ and second reference signals $V_{ref21}$ to $V_{ref23}$ according to the first control signals $S_{c11}$ to $S_{c13}$ and the second control signals $S_{c21}$ to $S_{c23}$, generates a first transfer signal $S_{t1}$ according to at least the sample signal $V_{sh}$ among the sample signal $V_{sh}$, the first reference signals $V_{ref11}$ to $V_{ref13}$ and a first feedback signal $S_{fb1}$, generates a second transfer signal $S_{t2}$ according to at least the sample signal $V_{sh}$ among the sample signal $V_{sh}$, the second reference signals $V_{ref11}$ to $V_{ref13}$ and the first feedback signal $S_{fb1}$, and further generates the first feedback signal $S_{fb1}$ and the residual signal $V_{residue}$ according to one of the first transfer signal $S_{t1}$ and the second transfer signal $S_{t2}$.

In other words, the alternate digital/analog converting module 4 can generate the first transfer signal $S_{t1}$ at first time according to the sample signal $V_{sh}$, respectively receive the second reference signals $V_{ref21}$ to $V_{ref23}$ according to the second control signals $S_{c21}$ to $S_{c23}$, generate the second transfer signal $S_{t2}$ according to one of the second reference signals $V_{ref21}$ to $V_{ref23}$ and the sample signal $V_{sh}$, generate the first feedback signal $S_{fb1}$ and the residual signal $V_{residue}$ according to the first transfer signal $S_{t1}$ and the second transfer signal $S_{t2}$, and further generate the first transfer signal $S_{t1}$ according to first feedback signal $S_{fb1}$.

At the second time, the alternate digital/analog converting module 4 generates the second transfer signal $S_{t2}$ according to the sample signal $V_{sh}$, receives the first reference signals $V_{ref11}$ to $V_{ref13}$ according to the first control signals $S_{c11}$ to $S_{c13}$, respectively, generates the first transfer signal $S_{t1}$ according to one of the first reference signals $V_{ref11}$ to $V_{ref13}$ and the sample signal $V_{sh}$, generates the first feedback signal $S_{fb1}$ and the residual signal $V_{residue}$ according to the first transfer signal $S_{t1}$ and the second transfer signal $S_{t2}$, and further generates the second transfer signal $S_{t2}$ according to the first feedback signal $S_{fb1}$.

In this embodiment, the alternate digital/analog converting module 4 includes a first converting unit 41, a second converting unit 42 and an amplifying unit 43. The first reference signal $V_{ref11}$ and the second reference signal $V_{ref21}$ may be coupled to the same positive power, the first reference signal $V_{ref12}$ and the second reference signal $V_{ref22}$ may be coupled to the same negative power, and the first reference signal $V_{ref13}$ and the second reference signal $V_{ref23}$ may be coupled to the same grounding power.

The first converting unit 41 decides to receive the first reference signals $V_{ref13}$ to $V_{ref13}$ according to the first control signals $S_{c11}$ to $S_{c13}$, respectively, and generates the first transfer signal $S_{t1}$ according to at least the sample signal $V_{sh}$ among the sample signal $V_{sh}$, the first reference signals $V_{ref11}$ to $V_{ref13}$ and the first feedback signal $S_{fb1}$.

In addition, the second converting unit 42 decides to receive the second reference signals $V_{ref21}$ to $V_{ref23}$ according to the second control signal $S_{c21}$ to $S_{c23}$, respectively, and generates the second transfer signal $S_{t2}$ according to at least the sample signal $V_{sh}$ among the sample signal $V_{sh}$, the second reference signals $V_{ref21}$ to $V_{ref23}$ and the first feedback signal $S_{fb1}$.

Furthermore, the amplifying unit 43 generates the first feedback signal $S_{fb1}$ and the residual signal $V_{residue}$ according to one of the first transfer signal $S_{t1}$ and the second transfer signal $S_{t2}$. Herein, the first feedback signal $S_{fb1}$ is inputted to one of the first converting unit 41 and the second converting unit 42.

Figure 5:
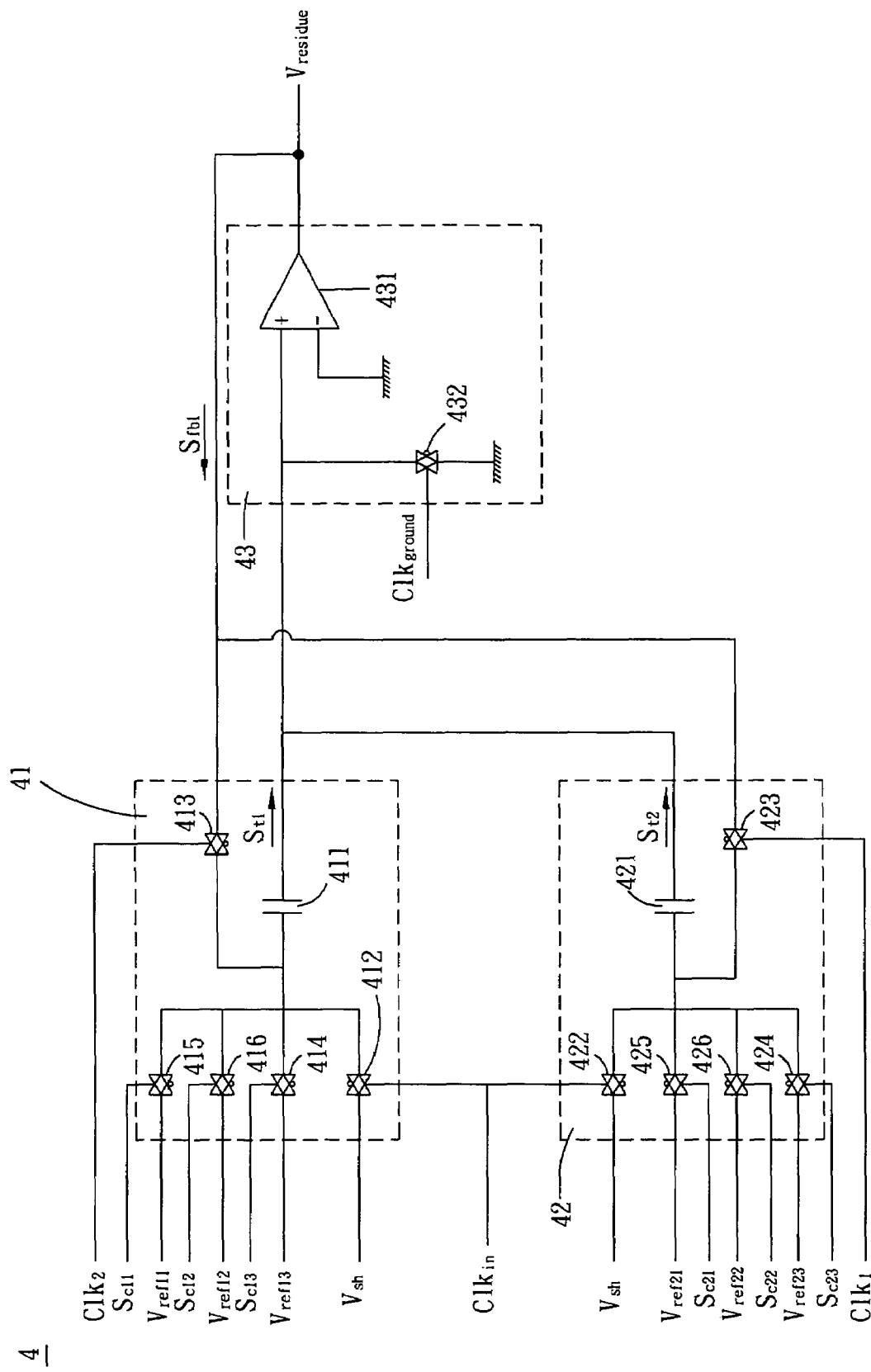
FIG. 5 is a circuit diagram showing an alternate digital/analog converting module of the cyclic pipeline analog to digital converter according to the embodiment of the invention.

As shown in FIG. 5, the first converting unit 41 of this embodiment includes a capacitor 411, a sampling switch 412, a feedback switch 413 and a plurality of capacitor switches 414 to 416. The sampling switch 412 controls the capacitor 411 to receive the sample signal $V_{sh}$. The capacitor switches 414 to 416 decides whether the capacitor 411 has to receive the first reference signals $V_{ref11}$ to $V_{ref13}$ according to the first control signals $S_{c11}$ to $S_{c13}$, respectively. The feedback switch 413 controls the capacitor 411 to receive the feedback signal $S_{fb1}$. The capacitor 411 generates the first transfer signal $S_{t1}$ according to at least the sample signal $V_{sh}$ among the sample signal $V_{sh}$, the first reference signals $V_{ref11}$ to $V_{ref13}$ and the first feedback signal $S_{fb1}$. The capacitor 411 coupled to the amplifying unit 43 outputs the first transfer signal $S_{t1}$ to the amplifying unit 43.

In this embodiment, the second converting unit 42 may include a capacitor 421, a sampling switch 422, a feedback switch 423 and a plurality of capacitor switches 424 to 426. The second sampling switch 422 controls the second capacitor 421 to receive the sample signal $V_{sh}$. The capacitor switches 424 to 426 decides whether the capacitor 421 has to receive the second reference signals $V_{ref21}$ to $V_{ref23}$ according to the second control signals $S_{c21}$ to $S_{c23}$, respectively. The feedback switch 423 controls the capacitor 421 to receive the first feedback signal $S_{fb1}$. The capacitor 421 generates the second transfer signal $S_{t2}$ according to at least the sample signal $S_{fb1}$ among the sample signal $V_{sh}$, the second reference signals $V_{ref1}$ to $V_{ref23}$ and the first feedback signal $S_{fb1}$. The capacitor 421 electrically connected to the amplifying unit 43 outputs the second transfer signal $S_{t2}$ to the amplifying unit 43.

In this embodiment, the amplifying unit 43 may include an amplifier 431 and a grounding switch 432. The amplifier 431 generates the first feedback signal $S_{fb1}$ and the residual signal $V_{residue}$ according to one of the first transfer signal $S_{t1}$ and the second transfer signal $S_{t2}$, and the grounding switch 432 decides to ground the capacitor 411 and the capacitor 421.

Referring again to FIGS. 4 and 5, the cyclic pipeline analog to digital converter 3 of this embodiment further includes a clock generating module 33 and a delay digital correction module 34.

The clock generating module 33 generates an input clock signal $Clk_{in}$, a grounding clock signal $Clk_{ground}$, a first clock signal $Clk_1$ and a second clock signal $Clk_2$. In this case, the first clock signal $Clk_1$ and the second clock signal $Clk_2$ are enabled at different time.

The sub-analog/digital converting module 32 generates a digital conversion signal $V_{dt}$ according to the sample signal $V_{sh}$, and further generates the first control signals $S_{c11}$ to $S_{c13}$ according to the first clock signal $Clk_1$ and the digital conversion signal $V_{dt}$, or generates the second control signals $S_{c21}$ to $S_{c23}$ according to the second clock signal $Clk_2$ and the digital conversion signal $V_{dt}$.

The delay digital correction module 34 properly corrects the digital conversion signal $V_{dt}$, which is generated at different time during the cyclic process, and thus generates a digital signal $V_{out}$.

Figure 6:
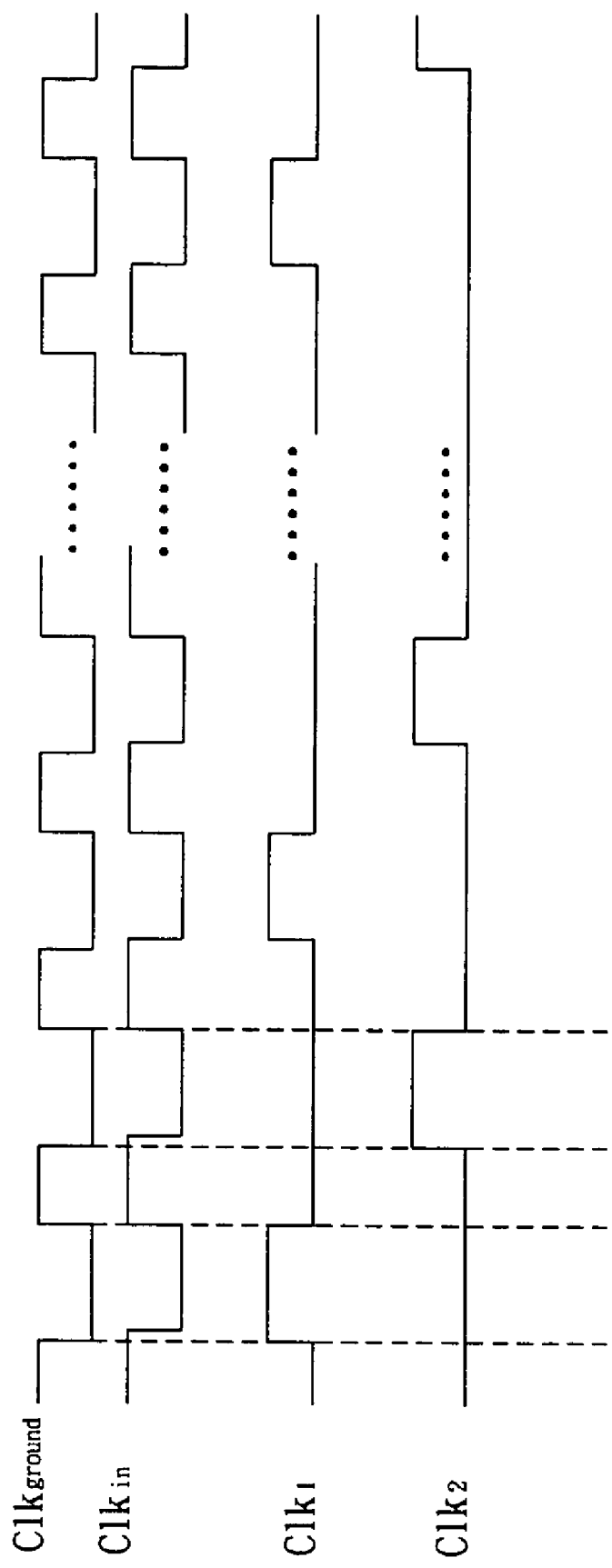
FIG. 6 is a timing chart showing clocks in the cyclic pipeline analog to digital converter according to the embodiment of the invention.

As shown in FIGS. 5 and 6, when the grounding clock signal $Clk_{ground}$ is enabled, the grounding switch 432 in the alternate digital/analog converting module 4 is ON such that the capacitor 411 and the capacitor 421 are grounded.

When the input clock signal $Clk_{in}$ is enabled, the sampling switch 412 and the sampling switch 422 in the alternate digital/analog converting module 4 enable the capacitor 411 and the capacitor 421 to receive the sample signal $V_{sh}$ and be charged. On the contrary, when the input clock signal $Clk_{in}$ is not enabled, the first transfer signal $S_{t1}$ and the second transfer signal $S_{t2}$, which are respectively generated by the capacitor 411 and the capacitor 421, discharge the amplifier 431.

At this time, however, the first clock signal $Clk_1$ or the second clock signal $Clk_2$ is enabled. If the first clock signal $Clk_1$ is enabled, the feedback switch 423 is ON to make the capacitor 421 receive the first feedback signal $S_{fb1}$. Meanwhile, one of the first control signals $S_{c11}$ to $S_{c13}$ is enabled due to the first clock signal $Clk_1$. Thus, one of the capacitor switches 414 to 416 is ON to make the capacitor 411 receive one of the first reference signals $V_{ref11}$ to $V_{ref13}$. At this time, the voltage relationship among the first feedback signal $S_{fb1}$, one of the first reference signals $V_{ref11}$ to $V_{ref13}$, and the sample signal $V_{sh}$ is described by Equation 2:

$$V_{sfb1} = \left(\frac{C_{411} + C_{421}}{C_{421}}\right)V_{vsh} + \left(\frac{C_{411}}{C_{421}}\right)V_{vref1} \quad \text{(Equation 2)}$$

Wherein, $V_{sfb1}$ is the voltage of the feedback signal $S_{fb1}$, $V_{vsh}$ is the voltage of the sample signal $V_{sh}$, $V_{ref1}$ is one of the voltages of the reference signals $V_{ref11}$ to $V_{ref13}$, $C_{411}$ and $C_{421}$ are respectively the capacitances of the capacitor 411 and capacitor 421, and the voltage of the residual signal $V_{residue}$ is the same as the voltage $V_{sfb1}$ of the feedback signal $S_{fb1}$.

On the other hand, if the second clock signal $Clk_2$ is enabled, the feedback switch 413 is ON to make the capacitor 411 receive the first feedback signal $S_{fb1}$. Meanwhile, one of the second control signals $S_{c21}$ to $S_{c23}$ is enabled due to the second clock signal $Clk_2$, so one of the capacitor switches 424 to 426 is ON to make the capacitor 421 receive one of the second reference signals $V_{ref21}$ to $V_{ref23}$. At this time, the voltage relationship among the first feedback signal $S_{fb1}$, one of the second reference signals $V_{ref21}$ to $V_{ref23}$, and the sample signal $V_{sh}$ is described by Equation 3:

$$V_{sfb1} = \left(\frac{C_{411} + C_{421}}{C_{411}}\right)V_{vsh} + \left(\frac{C_{421}}{C_{411}}\right)V_{vref2} \quad \text{(Equation 3)}$$

Wherein, $V_{sfb1}$ is the voltage of the feedback signal $S_{fb1}$, $V_{vsh}$ is the voltage of the sample signal $V_{sh}$, $V_{ref2}$ is the voltage of one of the reference signals $V_{ref21}$ to $V_{ref23}$, $C_{411}$ and $C_{421}$ are respectively the capacitances of the capacitor 411 and the capacitor 421, and the voltage of the residual signal $V_{residue}$ is the same as the voltage $V_{sfb1}$ of the feedback signal $S_{fb1}$.

Comparing the Equations 1 to 3, the alternate digital/analog converting module 4 of this embodiment enables the first feedback signal $S_{fb1}$ to be alternately fed back to one of the first converting unit 41 and the second converting unit 42 (i.e., to be alternately fed back to the capacitor 411 and the capacitor 421), and enables one of the first reference signals $V_{ref11}$ to $V_{ref13}$ and one of the second reference signals $V_{ref21}$ to $V_{ref23}$ to be inputted to the capacitor 411 and capacitor 421 at different time according to the first control signals $S_{c11}$ to $S_{c13}$ and the second control signals $S_{c21}$ to $S_{c23}$, respectively. Thus, the voltage of the residual signal $V_{residue}$ can be generated at different time according to the matching of different first reference signals $V_{ref11}$ to $V_{ref13}$, different second reference signals $V_{ref21}$ to $V_{ref23}$, and different capacitors, so as to the problem of matching between the capacitor 411 and the capacitor 421 may be eased.

Figure 7:
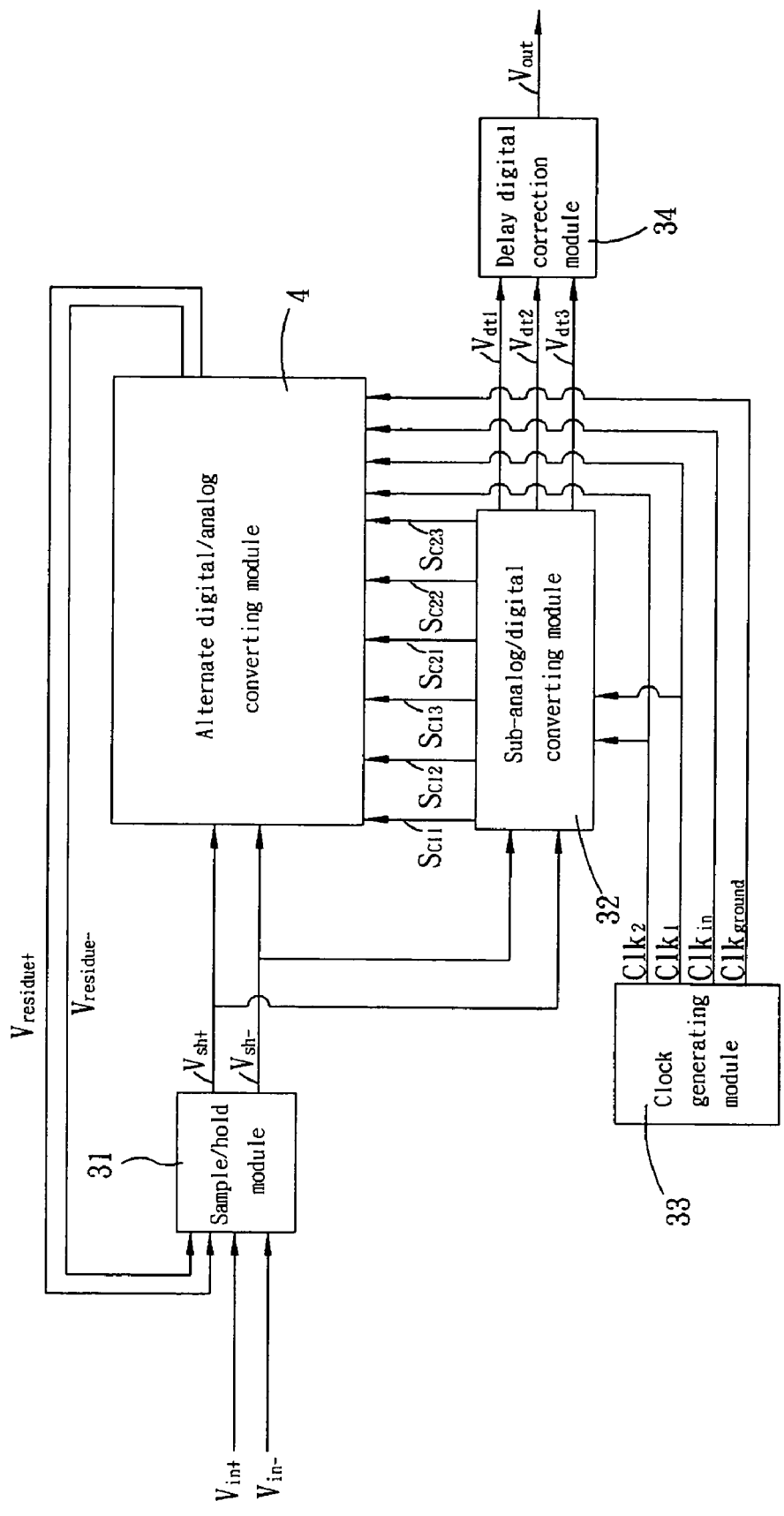
FIG. 7 is a block diagram showing the cyclic pipeline analog to digital converter and its clock generating module according to the embodiment of the invention.

As shown in FIG. 7, the sample/hold module 31 of this embodiment generates a sample signal $V_{sh+}$ and a sample signal $V_{sh-}$ according to an analog-input signal $V_{in+}$, an analog-input signal $V_{in-}$, a residual signal $V_{residue+}$ and a residual signal $V_{residue-}$.

The sub-analog/digital converting module 32 respectively generates a plurality of first control signals $S_{c11}$ to $S_{c13}$ according to the digital conversion signals $V_{dt1}$ to $V_{dt3}$ and the first clock signal $Clk_1$, wherein the digital conversion signals $V_{dt1}$ to $V_{dt3}$ are generated by the sample signal $V_{sh+}$ and the sample signal $V_{sh-}$, according to the first clock signal $Clk_1$ and the digital conversion signals $V_{dt1}$ to $V_{dt3}$, and respectively generates a plurality of second control signals $S_{c21}$ to $S_{c23}$ according to the second clock signal $Clk_2$ and the digital conversion signals $V_{dt1}$ to $V_{dt3}$.

The delay digital correction module 34 properly corrects the digital conversion signals $V_{dt1}$ to $V_{dt3}$ generated by the converter 3 at different time during the cyclic process and thus generates the digital signal $V_{out}$.

Figure 8:
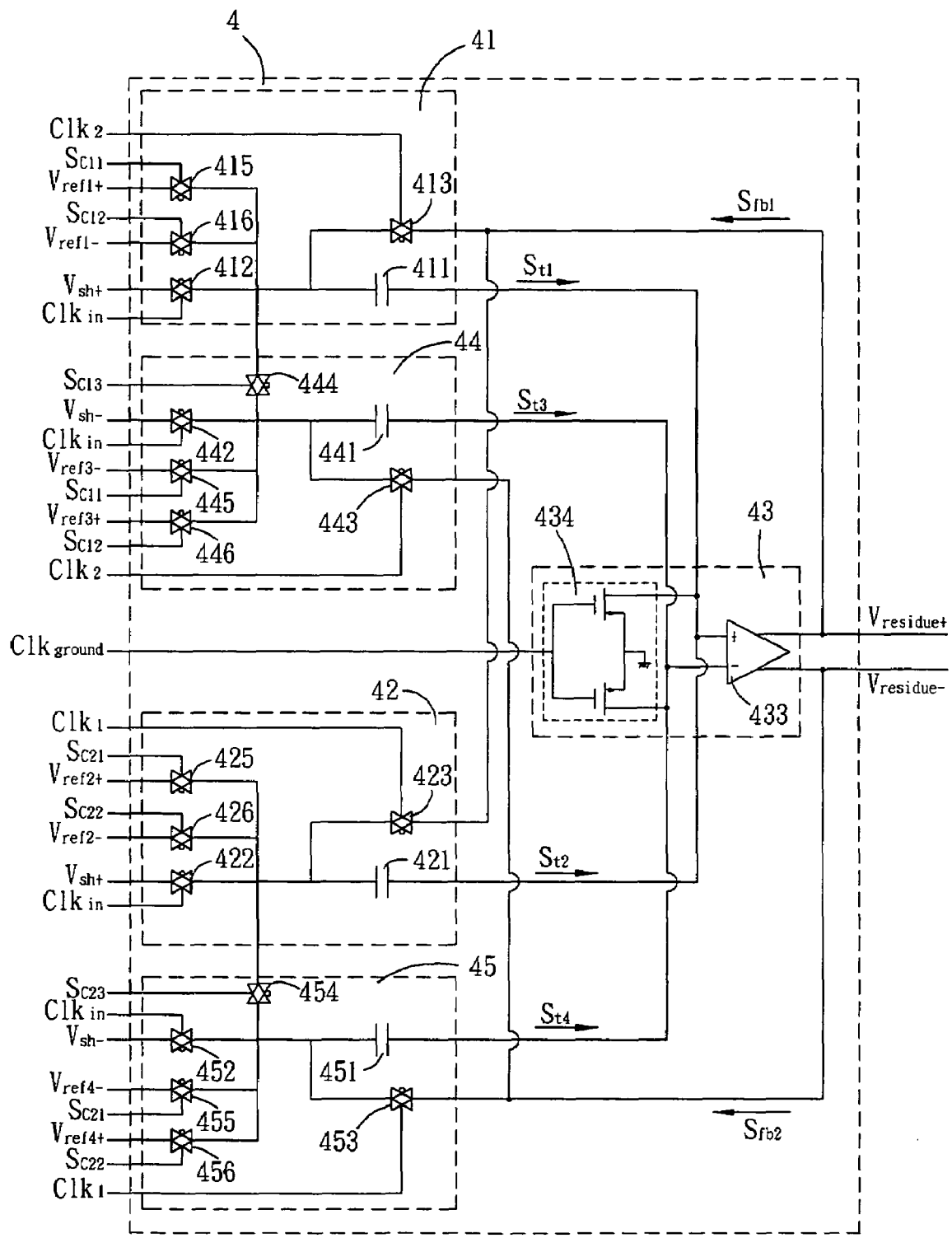
FIG. 8 is a circuit diagram showing the cyclic pipeline analog to digital converter according to the embodiment of the invention, wherein an amplifying unit includes a differential amplifier.

In detail, the alternate digital/analog converting module 4 of this embodiment includes a first converting unit 41, a second converting unit 42, an amplifying unit 43, a third converting unit 44 and a fourth converting unit 45, as shown in FIG. 8.

The first converting unit 41 decides to receive a first reference signal $V_{ref1+}$ and a first reference signal $V_{ref1-}$ according to the first control signal $S_{c11}$ and the first control signal $S_{c12}$, respectively, and generates the first transfer signal $S_{t1}$ according to at least the sample signal $V_{sh+}$ among the sample signal $V_{sh+}$, the first reference signal $V_{ref1+}$, the first reference signal $V_{ref1-}$ and the first feedback signal $S_{fb1}$.

The second converting unit 42 decides to receive a second reference signal $V_{ref2+}$ and a second reference signal $V_{ref2-}$ according to the second control signal $S_{c21}$ and the second control signal $S_{c22}$, respectively, and generates the second transfer signal $S_{t2}$ according to at least the sample signal $V_{sh+}$ among the sample signal $V_{sh+}$, the second reference signal $V_{ref2+}$, the second reference signal $V_{ref2-}$ and the first feedback signal $S_{fb1}$.

The third converting unit 44 decides to receive a third reference signal $V_{ref3-}$ and a third reference signal $V_{ref3+}$ according to the first control signal $S_{c11}$ and the first control signal $S_{c12}$, respectively, and generates a third transfer signal $S_{t3}$ according to at least the sample signal $V_{sh-}$ among the sample signal $V_{sh-}$, the third reference signal $V_{ref3+}$, the third reference signal $V_{ref3-}$ and a second feedback signal $S_{fb2}$.

The fourth converting unit 45 decides to receive a fourth reference signal $V_{ref4-}$ and a fourth reference signal $V_{ref4+}$ according to the second control signal $S_{c21}$ and the second control signal $S_{c22}$, respectively, and generates a fourth transfer signal $S_{t4}$ according to at least the sample signal $V_{sh-}$ among the sample signal $V_{sh-}$, the fourth reference signal $V_{ref4+}$, the fourth reference signal $V_{ref4-}$ and the second feedback signal $S_{fb2}$.

The amplifying unit 43 generates the first feedback signal $S_{fb1}$ according to one of the first transfer signal $S_{t1}$ and the second transfer signal $S_{t2}$, generates the second feedback signal $S_{fb2}$ according to one of the third transfer signal $S_{t3}$ and the fourth transfer signal $S_{t4}$, and generates the residual signal $V_{residue+}$ and the residual signal $V_{residue-}$ according to the first feedback signal $S_{fb1}$ and the second feedback signal $S_{fb2}$, respectively. In this case, the second feedback signal $S_{fb2}$ is inputted to one of the third converting unit 44 and the fourth converting unit 45.

In addition, the first converting unit 41 of this embodiment may include a capacitor 411, a sampling switch 412, a feedback switch 413 and a plurality of capacitor switches 415 and 416. The second converting unit 42 may include a capacitor 421, a sampling switch 422, a feedback switch 423 and a plurality of capacitor switches 425 and 426. The third converting unit 44 may include a capacitor 441, a sampling switch 442, a feedback switch 443 and a plurality of capacitor switches 444 to 446. The fourth converting unit 45 may include a capacitor 451, a sampling switch 452, a feedback switch 453 and a plurality of capacitor switches 454 to 456.

The amplifying unit 43 may include a differential amplifier 433 and a transistor switch 434. The differential amplifier 433 generates the second feedback signal $S_{fb2}$ according to one of the third transfer signal $S_{t3}$ and the fourth transfer signal $S_{t4}$, and generates the residual signal $V_{residue+}$ and the residual signal $V_{residue-}$ according to the first feedback signal $S_{fb1}$ and the second feedback signal $S_{fb2}$, respectively. Herein, the second feedback signal $S_{fb2}$ is inputted to one of the third converting unit 44 and the fourth converting unit 45.

As shown in FIGS. 6 and 8, when the grounding clock signal $Clk_{ground}$ is enabled, the transistor switch 434 of the alternate digital/analog converting module 4 enables the capacitor 411, the capacitor 421, the capacitor 441 and the capacitor 451 to be grounded.

When the input clock signal $Clk_{in}$ is enabled, the sampling switch 412 and the sampling switch 422 of the alternate digital/analog converting module 4 are ON to make the capacitor 411 and the capacitor 421 receive the sample signal $V_{sh+}$, and the sampling switch 442 and the sampling switch 452 are ON to make the capacitor 441 and the capacitor 451 receive the sample signal $V_{sh-}$.

When the input clock signal $Clk_{in}$ is not enabled, the sampling switch 412, the sampling switch 422, the sampling switch 442 and the sampling switch 452 are OFF. At this time, however, one of the first clock signal $Clk_1$ and the second clock signal $Clk_2$ is enabled.

If the first clock signal $Clk_1$ is enabled, the feedback switch 423 is ON to make the capacitor 421 receive the first feedback signal $S_{fb1}$, and the feedback switch 453 is ON to make the capacitor 451 receive the second feedback signal $S_{fb2}$. Meanwhile, if the first control signal $S_{c11}$ is enabled, the capacitor switch 415 and the capacitor switch 445 are ON to make the capacitor 411 and the capacitor 441 receive the first reference signal $V_{ref1+}$ and the third reference signal $V_{ref3-}$, respectively. In addition, if the first control signal $S_{c12}$ is enabled, the capacitor switch 416 and the capacitor switch 446 are ON to make the capacitor 411 and the capacitor 441 receive the first reference signal $V_{ref1-}$ and the third reference signal $V_{ref3+}$, respectively. Furthermore, if the first control signal $S_{c13}$ is enabled, the capacitor 411 is directly electrically connected to the capacitor 441.

On the other hand, if the second clock signal $Clk_2$ is enabled, the feedback switch 413 is ON to make the capacitor 411 receive the first feedback signal $S_{fb1}$, and the feedback switch 443 is ON to make the capacitor 441 receive the second feedback signal $S_{fb2}$. Meanwhile, if the second control signal $S_{c21}$ is enabled, the capacitor switch 425 and the capacitor switch 455 are ON to make the capacitor 421 and the capacitor 451 receive the second reference signal $V_{ref2+}$ and the fourth reference signal $V_{ref4-}$, respectively. In addition, if the second control signal $S_{c22}$ is enabled, the capacitor switch 426 and the capacitor switch 456 are ON to make the capacitor 421 and the capacitor 451 receive the second reference signal $V_{ref2-}$ and the fourth reference signal $V_{ref4+}$, respectively. Furthermore, if the second control signal $S_{c23}$ is enabled, the capacitor 421 is directly electrically connected to the capacitor 451.

In addition, the first reference signal $V_{ref1+}$, the second reference signal $V_{ref2+}$, the third reference signal $V_{ref3+}$ and the fourth reference signal $V_{ref4+}$ may be generated according to the same reference signal, or the same signal coupled to each converting unit. Similarly, the first reference signal $V_{ref1-}$, the second reference signal $V_{ref2-}$, the third reference signal $V_{ref3-}$ and the fourth reference signal $V_{ref4-}$ may be generated according to the same reference signal, or the same signal coupled to each converting unit.

In this embodiment, the first converting unit 41 and the third converting unit 44 are symmetrical circuits, and the second converting unit 42 and the fourth converting unit 45 are symmetrical circuits. The first converting unit 41, the second converting unit 42, the third converting unit 44 and the fourth converting unit 45 are electrically connected to the differential amplifier 433. Thus, the alternate digital/analog converting module 4 can ease the influence of the common mode noise.

In summary, in the cyclic pipeline analog to digital converter of the invention, the sub-analog/digital converting module alternately generates the first control signal and the second control signal at different time, so the alternate digital/analog converting module can alternately generate the residual signal according to the first control signal and the second control signal. Thus, the influence of the element matching in the digital/analog converting module may be eased such that the analog to digital converting result may be correctly generated.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A cyclic pipeline analog to digital converter, comprising:
    a sample/hold module, which generates a sample signal according to an analog-input signal and a residual signal;
    a sub-analog/digital converting module, which generates a first control signal and a second control signal at different time alternately according to a digital converting result of the sample signal; and
    an alternate digital/analog converting module, which decides to receive a first reference signal and a second reference signal separately according to the first control signal and the second control signal, generates a first transfer signal according to at least the sample signal among the sample signal, the first reference signal and a first feedback signal, generates a second transfer signal according to at least the sample signal among the sample signal, the second reference signal and the first feedback signal, and generates the first feedback signal and the residual signal according to one of the first transfer signal and the second transfer signal.

2. The cyclic pipeline analog to digital converter according to claim 1, further comprising:
    a clock generating module, which generates a first clock signal and a second clock signal, wherein the first clock signal and the second clock signal are enabled at different time.

3. The cyclic pipeline analog to digital converter according to claim 2, wherein the sub-analog/digital converting module generates the first control signal according to the first clock signal and the digital converting result and generates the second control signal according to the second clock signal and the digital converting result.

4. The cyclic pipeline analog to digital converter according to claim 1, wherein the alternate digital/analog converting module comprises:
    a first converting unit, which decides to receive the first reference signal separately according to the first control signal, and generates the first transfer signal according to at least the sample signal among the sample signal, the first reference signal and the first feedback signal;
    a second converting unit, which decides to receive the second reference signal separately according to the second control signal, and generates the second transfer signal according to at least the sample signal among the sample signal, the second reference signal and the first feedback signal; and
    an amplifying unit, which generates the first feedback signal and the residual signal according to one of the first transfer signal and the second transfer signal, wherein the first feedback signal is inputted to one of the first converting unit and the second converting unit.

5. The cyclic pipeline analog to digital converter according to claim 4, further comprising:
    a clock generating module, which generates a first clock signal and a second clock signal, wherein the first clock signal and the second clock signal are enabled at different time.

6. The cyclic pipeline analog to digital converter according to claim 5, wherein the first converting unit decides to receive the first feedback signal according to the second clock signal, and the second converting unit decides to receive the first feedback signal according to the first clock signal.

7. The cyclic pipeline analog to digital converter according to claim 4, wherein the first converting unit comprises:
    a first capacitor, which is electrically connected to the amplifying unit, and receives at least the sample signal among the sample signal, the first reference signal and the first feedback signal for generating the first transfer signal;
    a first feedback switch, which controls the first capacitor to receive the first feedback signal; and a first capacitor switch, decides the first capacitor to receive the first reference signal according to the first control signal.

8. The cyclic pipeline analog to digital converter according to claim 4, wherein the second converting unit comprises:
   a second capacitor, which is electrically connected to the amplifying unit, and receives at least the sample signal among the sample signal, the second reference signal and the first feedback signal for generating the second transfer signal;
   a second feedback switch, which controls the second capacitor to receive the first feedback signal; and
   a second capacitor switch, which decides the second capacitor to receive the first reference signal according to the second control signal.

9. The cyclic pipeline analog to digital converter according to claim 4, wherein the amplifying unit comprises:
   an amplifier, which generates the first feedback signal and the residual signal according to one of the first transfer signal and the second transfer signal.

10. The cyclic pipeline analog to digital converter according to claim 4, wherein the amplifying unit comprises:
    a grounding switch, which decides to ground the first capacitor and a second capacitor separately according to an input clock signal.

11. The cyclic pipeline analog to digital converter according to claim 4, wherein the alternate digital/analog converting module further comprises:
    a third converting unit, which decides to receive a third reference signal according to the first control signal and generates a third transfer signal according to at least the sample signal among the sample signal, the third reference signal and a second feedback signal; and
    a fourth converting unit, which decides to receive a fourth reference signal according to the second control signal, and generates a fourth transfer signal according to at least the sample signal among the sample signal, the fourth reference signal and the second feedback signal.

12. The cyclic pipeline analog to digital converter according to claim 11, wherein the amplifying unit generates the second feedback signal according to one of the third transfer signal and the fourth transfer signal, and generates the residual signal according to one of the first feedback signal and the second feedback signal, and the second feedback signal is inputted to one of the third converting unit and the fourth converting unit.

13. The cyclic pipeline analog to digital converter according to claim 12, wherein the amplifying unit comprises:
    a differential amplifier, which generates the first feedback signal according to one of the first transfer signal and the second transfer signal, generates the second feedback signal according to one of the third transfer signal and the fourth transfer signal, and generates the residual signal according to one of the first feedback signal and the second feedback signal.

* * * * *